(12) United States Patent
Tseng et al.

(10) Patent No.: US 8,616,539 B2
(45) Date of Patent: Dec. 31, 2013

(54) TRACK SPIN WAFER CHUCK

(75) Inventors: Wei-Hsiang Tseng, Park Hsinchu (TW); Jui-Chun Peng, Hsinchu (TW); Kai-Fa Ho, New Taipei (TW); Ho-Ping Chen, Park Hsinchu (TW); Chia-Yun Lee, Zhunan Township, Miaoli County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 8 days.

(21) Appl. No.: 13/328,254

(22) Filed: Dec. 16, 2011

(65) Prior Publication Data

US 2013/0156947 A1 Jun. 20, 2013

(51) Int. Cl.
*B25B 11/00* (2006.01)
(52) U.S. Cl.
USPC .......................................... 269/21; 269/289 R
(58) Field of Classification Search
USPC .................... 269/21, 20, 289 R; 29/281.1
See application file for complete search history.

(56) References Cited

U.S. PATENT DOCUMENTS

| 6,446,948 | B1 * | 9/2002 | Allen | 269/21 |
| 6,513,796 | B2 * | 2/2003 | Leidy et al. | 269/21 |
| 6,764,258 | B1 * | 7/2004 | Akre | 409/219 |
| 7,607,647 | B2 * | 10/2009 | Zhao et al. | 269/21 |
| 7,992,877 | B2 * | 8/2011 | Balan | 279/3 |
| 2002/0117792 | A1 * | 8/2002 | Leidy et al. | 269/21 |

* cited by examiner

*Primary Examiner* — Lee D Wilson
(74) *Attorney, Agent, or Firm* — Eschweiler & Associates, LLC (57) ABSTRACT

The present disclosure relates to a wafer chuck configured to provide a uniform photoresist layer on a workpiece. In some embodiments, the wafer chuck comprises a plurality of vacuum holes. The plurality of vacuum holes (i.e., more than one) are in fluid communication with a cavity that continuously extends along the top surface between the vacuum holes. A vacuum source, connected to each vacuum hole, is configured to remove gas molecules from the cavity located below the workpiece leaving behind a low pressure vacuum. The use of a plurality of vacuum holes increase the uniformity of the vacuum, thereby preventing the formation of high vacuum areas in close proximity to any specific vacuum hole. The reduction of high vacuum areas reduces wafer bending associated with the high vacuum areas.

17 Claims, 7 Drawing Sheets

TRACK SPIN WAFER CHUCK

BACKGROUND

Photoresist is a light sensitive material that is widely used in semiconductor processing. Typically, photoresist is deposited onto a semiconductor wafer using a spin coating method. The spin coating method is performed by placing a wafer on a wafer chuck having a single vacuum hole. The single vacuum hole generates an area of low pressure below the wafer, which causes atmospheric pressure to push down on the top surface of the wafer, securing it to the wafer chuck. The wafer is then spun at a high spin speed to form a photoresist layer covering the surface of the wafer. After the photoresist layer is formed, the wafer is removed from the wafer chuck and placed in an exposure tool configured to selectively expose the photoresist to a light source (e.g., a UV light) according to a photomask. Exposure to the light source causes a chemical change in the photoresist. The photoresist is then developed to remove selected portions of the photoresist (e.g., in a positive photoresist the exposed parts of the photoresist are removed).

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

In some embodiments, the present disclosure relates to a wafer chuck. The wafer chuck comprises a plurality of vacuum holes in fluid communication with a cavity, wherein the cavity continuously extends between the vacuum holes along a top surface of the wafer chuck that is configured to receive a workpiece. A vacuum source is connected to the plurality of vacuum holes and is configured to form a low pressure vacuum within the cavity, wherein respective vacuum holes are configured to contribute to formation of the low pressure vacuum within the cavity.

In another embodiment, the present disclosure relates to a rotatable wafer chuck system. The rotatable wafer chuck system comprises a rotatable wafer chuck having a first vacuum hole and a second vacuum hole in direct communication with a cavity located along a top surface of the rotatable wafer chuck. The first and second vacuum holes are respectively configured to generate first and second pressure regions within the cavity along with an intermediate pressure region located between the first and second pressure regions. The second pressure region reduces the pressure gradient between the first pressure region and the intermediate pressure region.

In another embodiment, the present disclosure relates to a method for forming a photoresist layer on a workpiece. The method comprises placing a workpiece on a top surface of a wafer chuck comprising a plurality of vacuum holes in direct communication with a cavity located between the wafer chuck and the workpiece. A vacuum source is operated in a manner that causes the plurality of vacuum holes to respectively contribute to formation of a low pressure vacuum within the cavity, resulting in an evenly distributed vacuum over the cavity that holds the workpiece to the wafer chuck. Photoresist is deposited onto the workpiece. The wafer chuck is then rotated at a high spin speed to evenly distribute the photoresist over the workpiece.

The following description and annexed drawings set forth in detail certain illustrative aspects and implementations of the disclosure. These are indicative of but a few of the various ways in which the principles of the disclosure may be employed.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Figure 1A:
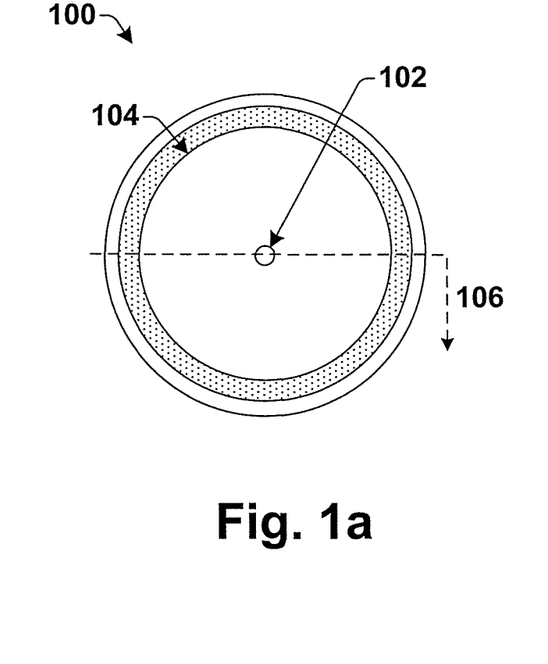
FIG. 1a illustrates a top view of a typical wafer chuck.

FIG. 1a illustrates a top view of a typical wafer chuck 100. The wafer chuck 100 comprises a single vacuum hole 102 located at approximately the center of the wafer chuck 100. The single vacuum hole 102 is configured to generate a low pressure vacuum within a cavity 104 located along the top surface of the wafer chuck 100.

Figure 1B:
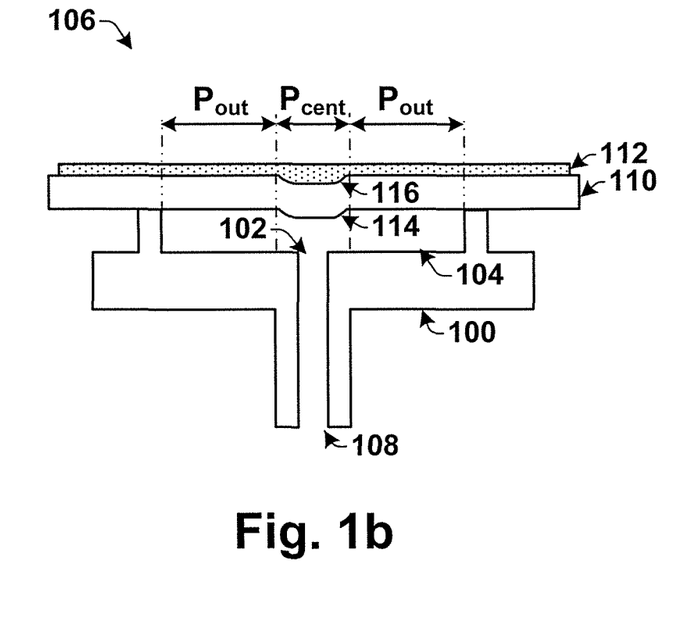
FIG. 1b illustrates a cross section of the wafer chuck with a workpiece.

FIG. 1b illustrates a cross sectional view 106 of the wafer chuck 100 with a workpiece 110 located on top of the wafer chuck 100. As illustrated in FIG. 1b, the single vacuum hole 102 is connected to a vacuum line 108. The vacuum line 108 carries gas molecules away from the cavity 104, located below the workpiece 110, to generate the low pressure vacuum within the cavity 104. The low pressure vacuum within the cavity 104 causes atmospheric pressure on the top surface of the workpiece to push down on the workpiece 110, thereby securing the workpiece 110 to the wafer chuck 100.

The inventors have appreciated that the use of a single vacuum hole 102 to generate a low pressure vacuum below the workpiece 110 forms a non-uniform vacuum within the cavity 104. For example, as illustrated in FIG. 1b, the vacuum hole 102 generates a high vacuum area $P_{cent}$ in close proximity to the vacuum hole 102. The high vacuum area $P_{cent}$ has a lower vacuum pressure than in regions $P_{out}$ at larger distances from the vacuum hole 102. This difference in vacuum pressure (e.g., $P_{cent} < P_{out}$) causes the atmospheric pressure to push down on the wafer with a greater force in the high vacuum area $P_{cent}$, forming a depression 114 in the workpiece 110 above the high vacuum area $P_{cent}$.

Figure 1C:
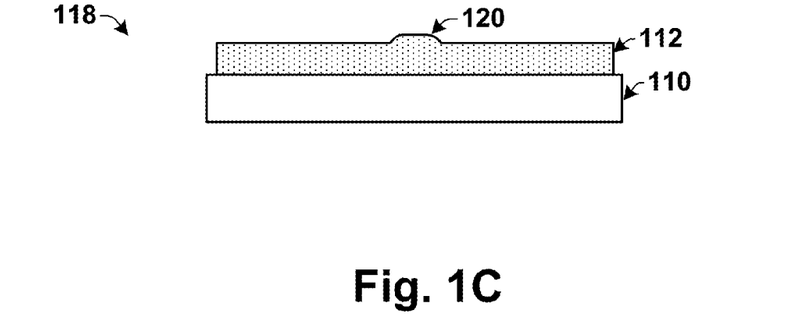
FIG. 1c illustrates a side view of the workpiece, after being removed from the wafer chuck, having an area of thicker photoresist in the region in which the workpiece was depressed.
Figure 1D:
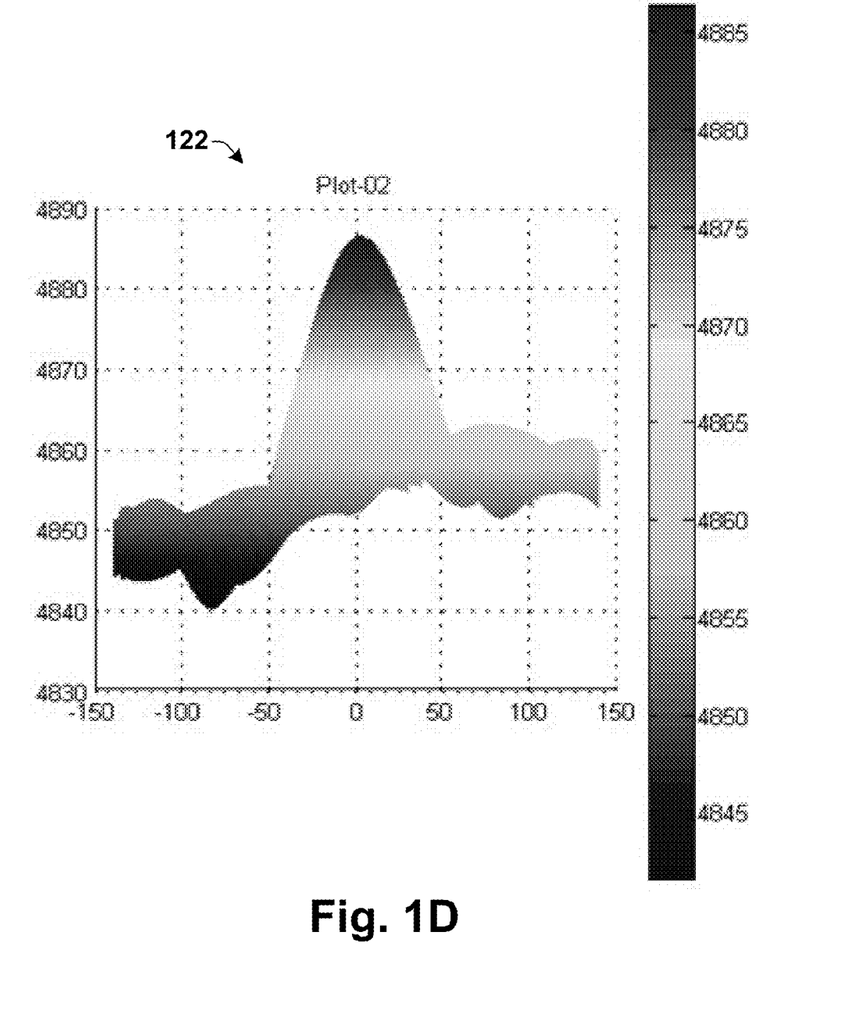
FIG. 1d illustrates a profile of the photoresist thickness as a function of wafer position for a 300 mm wafer.

When photoresist 112 is applied to the workpiece 110 the vacuum is on, causing an area of thicker photoresist 116 to form in the depression 114 of the workpiece 110. After coating the workpiece 110 with photoresist 112, the vacuum is turned off and the workpiece 110 is removed from the wafer chuck 100. As illustrated in the side view 118 of FIG. 1c, after the workpiece 110 is removed from the wafer chuck the workpiece 110 bends back to a flat shape, removing the depression and causing the area of thicker photoresist to form a bump 120 in the photoresist 112. FIG. 1d illustrates a graph 122 showing a profile of the photoresist thickness as a function of wafer position for a 300 mm wafer. As illustrated in the graph 122, the photoresist in the center 100 mm of the wafer has a bump with a thickness of 4885 Å compared to a thickness of approximately 4860 Å over the remainder of the wafer.

Workpiece bending was not a problem in smaller workpieces, such as for example, wafers having a diameter of less than 300 mm. However, as workpiece sizes have increased to 300 mm or 450 mm, the vacuum pressure used to hold a workpiece onto a wafer chuck has increased due to an increase in the mass of the workpiece. This increase in vacuum pressure causes an increased difference in pressure between an area in close proximity to the single vacuum hole and more distant areas, thereby increasing the difference in photoresist thickness. Moreover, as photoresist thickness decreases (e.g., from approximately 4000 Å in a 130 nm processing node, to approximately 2500 Å in a 90 nm processing node, to 1250 Å in a 45 nm processing node, etc.) the photoresist bump effect becomes proportionally greater. Such uneven photoresist film thickness lowers patterning accuracy in the photolithographic process.

Accordingly, some aspects of the present disclosure provide for wafer chuck that prevents the uneven distribution of photoresist onto a workpiece. The wafer chuck is configured to increase the uniformity of the vacuum formed between a workpiece and a wafer chuck, thereby preventing high vacuum areas that cause workpiece bending. In some embodiments, the disclosed wafer chuck comprises a plurality of vacuum holes (i.e., more than one). The plurality of vacuum holes are in fluid communication with a cavity (i.e., are connected with one another to allow for the flow of particles between the vacuum holes and the cavity), which extends between the plurality of vacuum holes. A vacuum source is connected to each vacuum hole and is configured to remove gas molecules from the cavity, leaving behind a low pressure vacuum within the cavity, which located between the wafer chuck and the workpiece. The use of a plurality of vacuum holes increases the uniformity of the low pressure vacuum within the cavity. This prevents the formation of high vacuum areas below the workpiece and reduces workpiece bending associated with the high vacuum areas.

Figure 2:
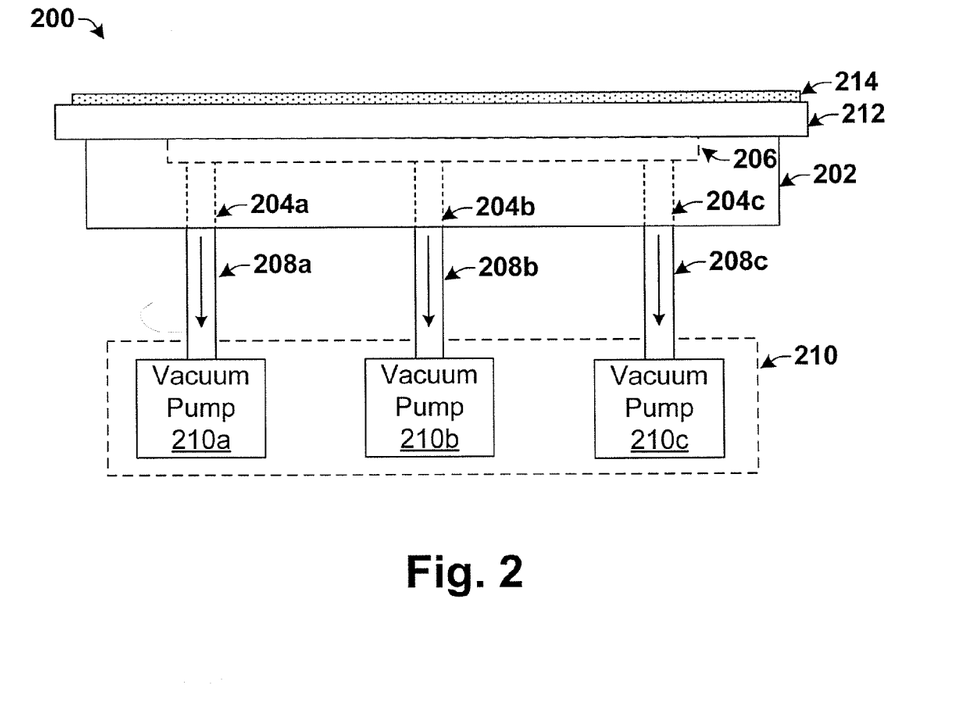
FIG. 2 illustrates a block diagram of an embodiment of a wafer chuck configured to prevent the uneven distribution of photoresist onto a workpiece.

FIG. 2 illustrates a block diagram of an embodiment of a vacuum wafer chuck system 200 configured to prevent the uneven distribution of photoresist onto a workpiece. The vacuum wafer chuck system 200 comprises a wafer chuck 202 having a top surface configured to receive a workpiece 212. The wafer chuck 202 is rotatable, such that during an application of a photoresist material 214, the wafer chuck can be rotated at a high spin speed to evenly distribute the photoresist material 214 onto the workpiece 212.

A plurality of vacuum holes 204a-204n are in fluid communication with a cavity 206 located within the top surface of the wafer chuck 202, allowing for particles to flow between the vacuum holes 204a-204n and the cavity 206. The vacuum holes 204 are respectively configured to contribute to the formation of a low pressure vacuum within the cavity 206 (i.e., the vacuum within the cavity 206 is equal to the number of vacuum holes 204 multiplied by the pressure formed by each vacuum hole). The inventors have appreciated that the vacuum formed by any given vacuum hole (e.g., 204a or 204b) is not uniform over the cavity 206, but instead is lowest within an area in close proximity to the given vacuum hole and increases as a function of the distance from the given vacuum hole. Accordingly, the use of multiple vacuum holes 204a-204c, distributed at different locations within the cavity 206, reduces the presence of low pressure regions within the cavity 206 since it increases the pressure at which each vacuum hole can operate to achieve the overall vacuum pressure. In other words, a same overall vacuum pressure can be achieved within the cavity 206 by operating a larger number of vacuum holes at a higher pressure than a smaller number of vacuum holes at a lower pressure.

The resulting low pressure vacuum within cavity 206 causes atmospheric pressure to push down on the workpiece 212 to hold it in contact with the wafer chuck 202 during operation. However, reduction of high vacuum regions within the cavity 206 reduces bending of the workpiece 212 caused by atmospheric pressure pushing against the workpiece 212. Therefore, the wafer chuck 202 results in an improvement of photo resist uniformity by more than 50%.

The vacuum holes 204a-204c are connected to a vacuum source 210 by way of one or more vacuum lines 208a-208c. The vacuum source 210 may comprise one or more vacuum pumps 210a-210c. In some embodiments, each vacuum hole 204 is connected to a same vacuum source 210. For example, vacuum hole 204a is connected to vacuum pump 210a by way of vacuum line 208a, vacuum hole 204b is connected to vacuum pump 210b by way of vacuum line 208b, etc. In another embodiment, each vacuum hole 204a-204c is connected to a different vacuum source. For example, vacuum holes 204a-204c are connected to vacuum pumps 210a-210c by way of vacuum lines 208a-208c, respectively.

Therefore, as shown in FIG. 2, the disclosed wafer chuck 202 utilizes multiple vacuum holes 204a-204c to form a low pressure vacuum within cavity 206, thereby allowing for the pressure applied by any single vacuum hole to be increased. Such an increase in pressure reduces wafer bending.

Figure 3:
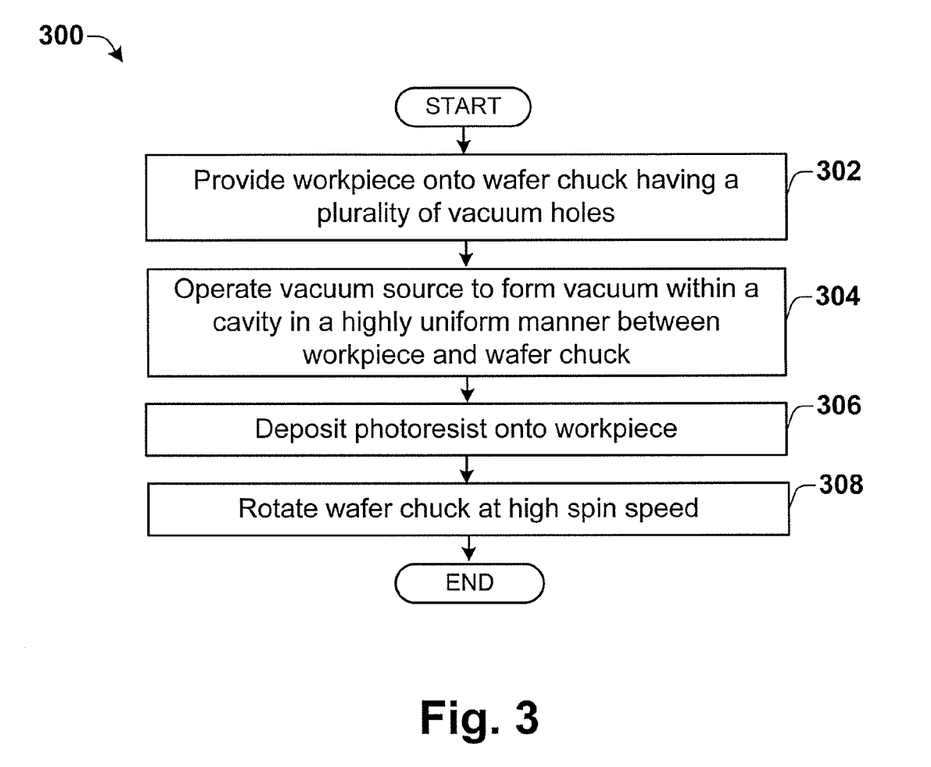
FIG. 3 illustrates a flow diagram of some embodiments of a method for forming a substantially uniform photoresist layer onto a workpiece.

FIG. 3 illustrates a flow diagram of some embodiments for a method 300 of forming a substantially uniform photoresist layer onto a workpiece. While the method 300 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302 a workpiece is provided onto a wafer chuck having a plurality of vacuum holes. The plurality of vacuum holes are in fluid communication with a cavity located between the wafer chuck and the workpiece. In other words, the vacuum holes are connected to the cavity in a manner that allows for particles to flow between the vacuum holes and the cavity.

At 304 a vacuum source is operated to form a low pressure vacuum within a cavity located between the wafer chuck and the workpiece. As stated above, the use of multiple vacuum holes allows for the formation of a highly uniform vacuum without having low pressure regions.

At 306 photoresist is deposited onto the workpiece. In some embodiments, a volume of photoresist sufficient to cover the workpiece is distributed at a location substantially in the middle of the workpiece.

At 308 the wafer chuck is rotated at a high spin speed. In some embodiments, the wafer chuck is operated at a first spin speed for a first time period and a second larger spin speed for a second longer time period. In one embodiment, the first spin speed is from approximately 100-500 RPMs, while the second spin speed is from approximately 2000-4000 RPMs.

Figure 4:
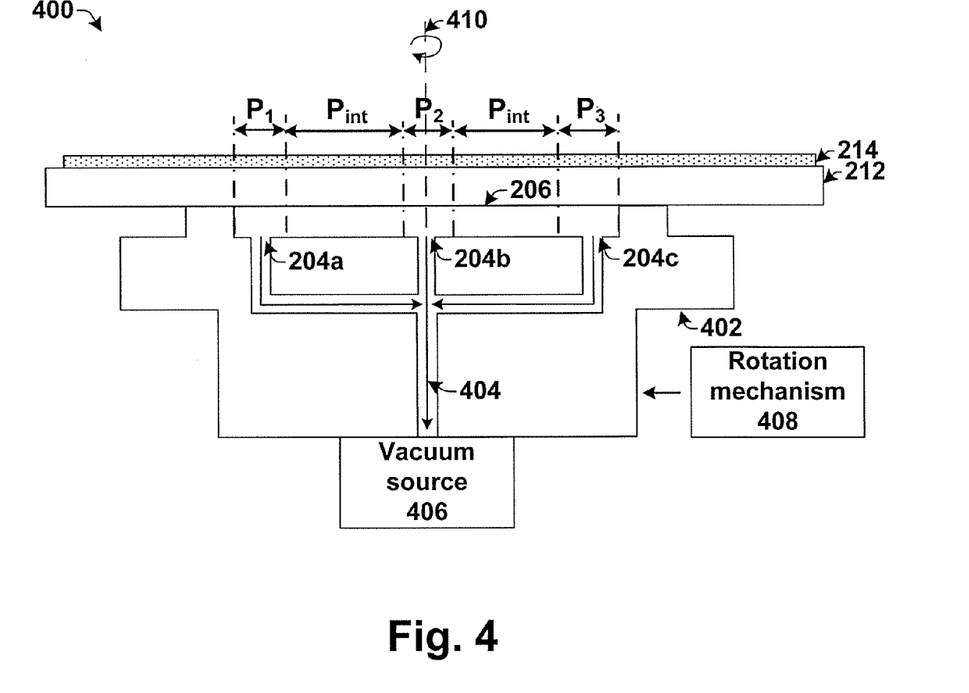
FIG. 4 illustrates a cross sectional view of an embodiment of wafer chuck as described herein.

FIG. 4 illustrates a cross sectional view of one embodiment of vacuum wafer chuck system 400 as described herein. The vacuum wafer chuck system 400 comprises a wafer chuck 402 having a plurality of vacuum holes 204a-204c connected to a single vacuum source 406 by way of single vacuum line 404, running along an axis of rotation 410. The vacuum wafer chuck system 400 further comprises a rotational mechanism 408 configured to rotate the wafer chuck 402 around the axis of rotation 410 extending normal to the center of the wafer chuck 402.

The vacuum holes 204a-204c are configured to generate a low pressure vacuum within a cavity 206 located between the wafer chuck 402 and a workpiece 212. Respective vacuum holes 204a-204c are configured to generate separate pressure regions within the cavity 206. For example, a first vacuum hole 204a is configured to generated a first pressure region $P_1$ within the cavity 206 and a second vacuum hole 204b is configured to generate a second pressure region $P_2$ within the cavity 206. An intermediate pressure region $P_{int}$ is located between the pressure regions $P_1$ and $P_2$. Because each vacuum hole 204a-204c contributes to the formation of the low pressure vacuum within the cavity 206, the pressure within any of the pressure regions $P_1$-$P_3$ can be held at a higher vacuum pressure than in wafer chucks having a single vacuum hole.

Therefore, the pressure gradient formed between the pressure region of any particular vacuum hole and an intermediate pressure region $P_{int}$ is reduced by the other vacuum holes, resulting in a relatively high uniformity in the vacuum throughout the cavity 206. For example, the second pressure region $P_2$ reduces the pressure gradient between the first pressure region $P_1$ and the intermediate pressure region $P_{int}$ by allowing a higher pressure in the first and second pressure regions, $P_1$ and $P_2$, to be used to achieve the low vacuum pressure within the cavity 206.

In some embodiments, the wafer chuck 400 is configured to receive a workpiece 212 having a diameter of greater than or equal to 300 mm. For example, in some embodiments, the wafer chuck 400 is configured to receive a workpiece 212 having a diameter of 300 mm. In other embodiments, the wafer chuck 400 is configured to receive a workpiece 212 having a diameter of 450 mm. In such embodiments, the use of multiple vacuum holes 204a-204c can form a low pressure vacuum within the cavity 206, without forming low pressure regions that would otherwise result from the lower pressure within the cavity 206 required to affix a such large workpieces to the wafer chuck 400. It will be appreciated that the pressure generated by each vacuum hole will vary depending on the maximum spin speed of the workpiece in a given spin coating recipe.

Figure 5:
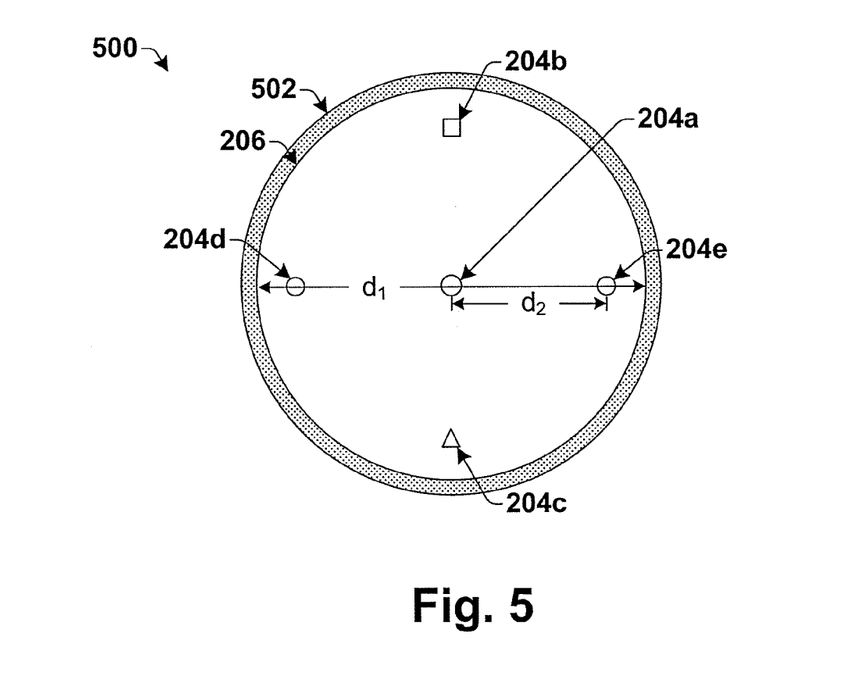
FIG. 5 illustrates a top view of an embodiment of a wafer chuck comprising a plurality of vacuum holes.

FIG. 5 illustrates a top view of some embodiments of a wafer chuck 500 comprising a plurality of vacuum holes 204a-204e. The wafer chuck 500 has a cavity 206 that extends over a distance of $d_1$. In some embodiments, the vacuum holes 204a-204e are separated by a minimum center-to-center distance of $d_2$. In some embodiments, the minimum distance $d_2$ is greater than or equal to $\frac{1}{3}^{rd}$ the distance $d_1$. Such a separation between the vacuum holes 204a-204e improves uniformity of the vacuum throughout the cavity 206 and reduces high vacuum areas in the cavity 206.

It will be appreciated that the shape of the vacuum holes 204a-204e can vary in different embodiments without substantially reducing the uniformity of the low pressure vacuum formed within cavity 206. For example, in some embodiments, the vacuum holes 204a-204e comprise circular shaped vacuum holes. In another embodiment, the vacuum holes 204a-204e comprise triangular, square, and/or polygon shaped vacuum holes. For example, as shown in FIG. 5, vacuum holes 204a, 204d, and 204d are circular, vacuum hole 204b is square, and vacuum hole 204c is triangular.

Figure 6:
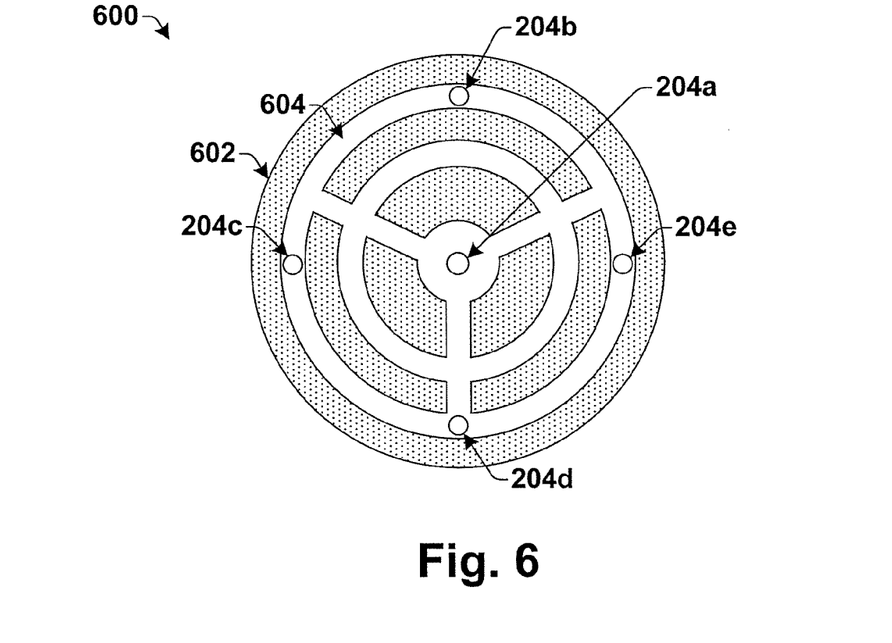
FIG. 6 illustrates a top view of an embodiment of a wafer chuck as described herein.

FIG. 6 illustrates a top view of an alternative embodiment of a wafer chuck 600 as described herein. A cavity 206 within the top surface of the wafer chuck 600 comprises one or more concentric trenches 604. The concentric trenches 604 are in direct communication with the plurality of vacuum holes 204a-204e. Therefore, each the plurality of vacuum holes 204a-204e respectively contribute to formation of a low pressure vacuum within the concentric trenches 604.

Figure 7A:
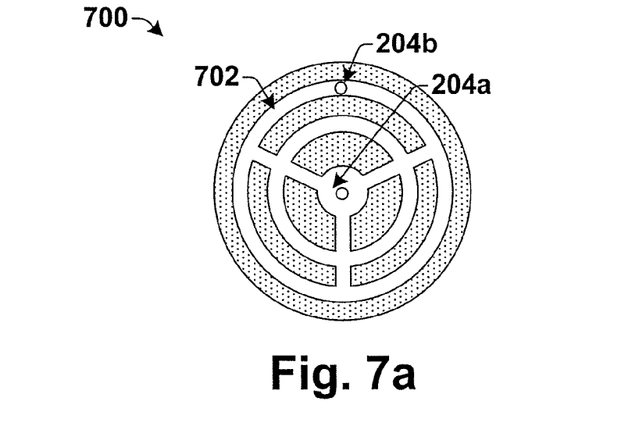
FIGS. 7a-7c illustrate top views of some embodiments of a wafer chuck having various exemplary vacuum hole configuration.
Figure 7B:
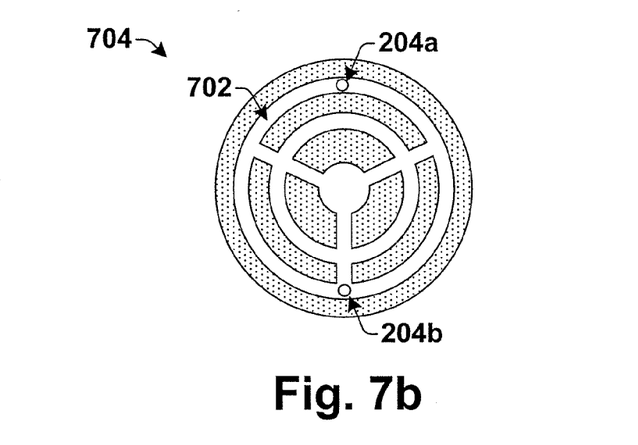
Figure 7C:
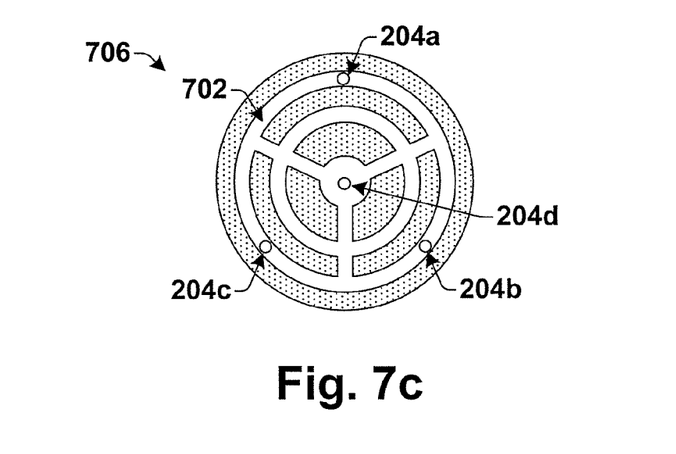

FIGS. 7a-7c illustrate top views of some embodiments of wafer chucks having various exemplary vacuum hole configurations. It will be appreciated that the exemplary configurations are not limiting embodiments, but are rather exemplary embodiments that are intended to aid the reader in understanding of the disclosed wafer chuck. For example, although FIGS. 7a-7c illustrate a cavity comprising concentric trenches, in alternative embodiments the cavity may comprise alternative structures Furthermore, one of ordinary skill in the art will appreciated that alternative configurations of vacuum homes may fall within the scope of the disclosure.

FIGS. 7a and 7b illustrate some embodiments of wafer chucks having a plurality of vacuum holes disposed in a linear pattern. For example, in FIG. 7a wafer chuck 700 comprises a first vacuum hole 204a in the center of the wafer and a second vacuum hole 204b located within an outer trench 702 of the wafer chuck 700. In FIG. 7b the wafer chuck 704 comprises a first vacuum hole 204a located within an outer trench 702 of the wafer chuck 704 and a second vacuum hole 204b located within the outer trench 702 along an opposite side of the wafer chuck 704.

Referring to FIG. 7c, wafer chuck 706 comprises a plurality of vacuum holes 204a-204c configured within a triangular pattern along the outer trench 702 of the wafer chuck 706. A fourth vacuum hole 204d is located in the center of the wafer chuck 706.

It will be appreciated that equivalent alterations and/or modifications may occur to those of ordinary skill in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A wafer chuck, comprising:
a plurality of vacuum holes in fluid communication with a cavity that continuously extends between the vacuum holes along a top surface of the wafer chuck that is configured to receive a workpiece, wherein the cavity comprises a plurality of concentric trenches respectively disposed between abutting ridges of the wafer chuck configured to physically contact the workpiece at apex of the ridges; and
a vacuum source connected to the plurality of vacuum holes and configured to form a low pressure vacuum within the cavity, wherein respective vacuum holes are configured to contribute to formation of the low pressure vacuum within the cavity.

2. The wafer chuck of claim 1, further comprising:
a rotational mechanism configured to rotate the wafer chuck comprising the plurality of vacuum holes around an axis of rotation extending normal to the center of the wafer chuck.

3. The wafer chuck of claim 1, wherein the vacuum source comprises a single vacuum pump, connected to the plurality of vacuum holes by way of a vacuum line.

4. The wafer chuck of claim 1, wherein the wafer chuck comprises a wafer reception area, configured to receive the workpiece, having a diameter of greater than or equal to 300 mm.

5. The wafer chuck of claim 1, wherein the plurality of vacuum holes are separated from one another by a distance that is greater than or equal to $\frac{1}{3}^{rd}$ a diameter of the wafer chuck.

6. The wafer chuck of claim 1, wherein the plurality of vacuum holes comprise at least three vacuum holes disposed in a triangular pattern.

7. The wafer chuck of claim 1, wherein the plurality of vacuum holes comprise at least two vacuum holes disposed in a linear pattern.

8. The wafer chuck of claim 1, wherein the vacuum holes comprise a triangular, square, or polygon shape.

9. A rotatable wafer chuck system, comprising:
a rotatable wafer chuck having a first vacuum hole and a second vacuum hole in direct communication with a cavity located along a top surface of the rotatable wafer chuck;
a rotational mechanism configured to rotate the wafer chuck having the first vacuum hole and the second vacuum hole;
wherein the first and second vacuum holes are configured to contribute to formation of a low pressure vacuum within the cavity by respectively generating first and second pressure regions within the cavity along with an intermediate pressure region located between the first and second pressure regions; and
wherein the second pressure region reduces the pressure gradient between the first pressure region and the intermediate pressure region.

10. The rotatable wafer chuck system of claim 9, wherein the first and second vacuum holes are disposed in a linear pattern.

11. The rotatable wafer chuck system of claim 9, wherein the plurality of vacuum holes comprise at least three vacuum holes disposed in a triangular pattern.

12. The rotatable wafer chuck system of claim 9, wherein rotatable the wafer chuck comprises a wafer reception area, configured to receive a workpiece, having a diameter of greater than or equal to 300 mm.

13. The rotatable wafer chuck system of claim 9, wherein the vacuum holes are separated from one another by a distance that is greater than or equal to $\frac{1}{3}^{rd}$ diameter of the rotatable wafer chuck.

14. The rotatable wafer chuck system of claim 9, wherein the cavity comprises a plurality of concentric trenches within the top surface, wherein the plurality of concentric trenches are respectively disposed between abutting ridges of the rotatable wafer chuck configured to physically contact the workpiece at apex of the ridges.

15. The wafer chuck of claim 1, wherein the plurality of concentric trenches comprise:
a first concentric trench located between a first ridge configured to contact the workpiece and a second ridge configured to contact the workpiece; and
a second concentric trench located between the second ridge and a third ridge configured to contact the workpiece.

16. The rotatable wafer chuck system of claim 14, wherein the plurality of concentric trenches comprise:
a first concentric trench located between a first ridge configured to contact the workpiece and a second ridge configured to contact the workpiece; and
a second concentric trench located between the second ridge and a third ridge configured to contact the workpiece.

17. A wafer chuck, comprising:
a plurality of vacuum holes in fluid communication with a cavity that continuously extends between the vacuum holes along a top surface of the wafer chuck that is configured to receive a workpiece, wherein the cavity is disposed between abutting ridges of the wafer chuck that are configured to physically contact a workpiece at apex of the ridges; and
a vacuum source connected to the plurality of vacuum holes and configured to form a low pressure vacuum within the cavity, wherein respective vacuum holes are configured to contribute to formation of the low pressure vacuum within the cavity.

* * * * *